INVENTORS
J. F. CUBBIDGE
W. D. DRUKKER
BY
A. C. Schwarz, Jr.
ATTORNEY

INVENTORS
J. F. CUBBIDGE
W. D. DRUKKER
BY a. C. Schwarz, Jr.
ATTORNEY

Oct. 17, 1961 J. F. CUBBIDGE ET AL 3,004,262

APPARATUS FOR ATTACHING ELECTRICAL COMPONENTS TO WIRING BOARDS

Filed July 14, 1959 5 Sheets-Sheet 3

INVENTORS
J. F. CUBBIDGE
W. D. DRUKKER
BY A. C. Schwarz, Jr.
ATTORNEY

INVENTORS
J. F. CUBBIDGE
W. D. DRUKKER
BY
A. C. Schwarz, Jr.
ATTORNEY

INVENTORS
J. F. CUBBIDGE
W. D. DRUKKER
BY A. C. Schwarz, Jr.
ATTORNEY 3,004,262

APPARATUS FOR ATTACHING ELECTRICAL COMPONENTS TO WIRING BOARDS

James F. Cubbidge, Naperville, and Willard D. Drukker, Downers Grove, Ill., assignors to Western Electric Company, Incorporated, New York, N.Y., a corporation of New York Filed July 14, 1959, Ser. No. 827,077
7 Claims. (Cl. 1—323)

This invention relates to apparatus for attaching electrical components to wiring boards and more particularly to apparatus for preforming the leads of electrical components and bending them about a printed circuit wiring board to attach the electrical component thereto with the body of the component in spaced relation to the board.

An object of the present invention is to provide an improved apparatus for attaching electrical components onto printed wiring boards.

Another object of the invention is to provide an improved apparatus for preforming the leads of an electrical component and clinching them to a wiring board to attach the electrical component to the board with the body thereof in spaced relation to the board.

With these and other objects in view, the present invention contemplates the provision of a carrier for supporting the wiring board between a pair of stationary shearing members having shearing surfaces engageable with coaxially aligned leads extending from opposite ends of an electrical component for supporting the component above the wiring board. A lead-forming anvil is moved into operative position beneath the electrical component and a pair of dies on a movable shearing member cooperates with the stationary shearing members to shear the leads and bend portions thereof about the ends of the anvil into parallel relation to each other and at right angles to the axis of the component. A forming member disposed between the dies of the movable shearing member and above the anvil is movable with the shearing member toward and cooperates with the anvil to bend the intermediate portions of the leads laterally from the axis of the component to form shoulders thereon engageable with the wiring board to support the body of the component above and in spaced relation to the board. After the leads of the electrical component have been sheared and formed, the anvil is retracted and the movable shearing member and forming member advance the electrical component to bring the shoulders of the lead into engagement with the wiring board and with the parallel ends of the leads astraddle opposite edges of the wiring board and with portions of the leads projecting below the board. A pair of clinching members disposed on opposite sides of the carrier are then actuated to bend the depending end portions of the leads under the board to clinch the leads thereto and secure the electrical component to the board with the body of the component supported in spaced relation to the board and with the leads located in predetermined positions on the board in engagement with circuit-forming conductors thereon.

Other objects and advantages of the invention will become apparent by reference to the following detailed description thereof and the accompanying drawings illustrating a preferred embodiment thereof in which.

Figure 12:
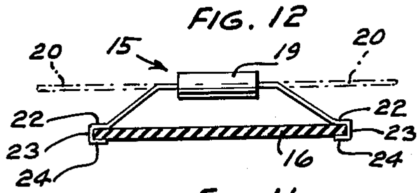
FIG. 12 is a cross-sectional view of the wiring board with the component secured thereto taken on line 12—12 of FIG. 11.
Figure 11:
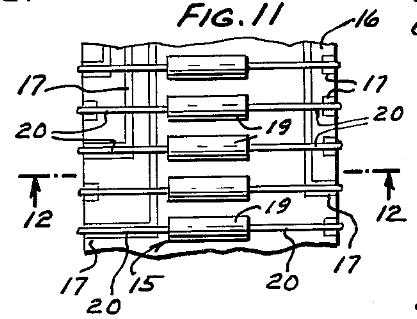
FIG. 11 is a fragmentary plan view of a wiring board with a plurality of electrical components attached thereto.
Figure 6:
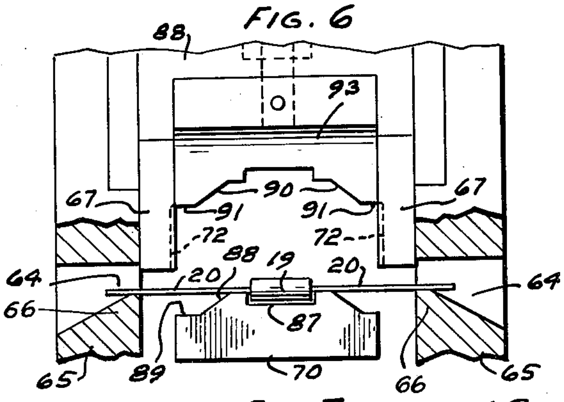
FIGS. 6–9 are fragmentary views showing progressive steps in the forming of the leads of the components and the attachment of the component to a wiring board.

The present apparatus is designed to automatically attach electrical components 15 (FIGS. 11 and 12) onto a flat printed wiring board 16 of substantially rectangular outline which is provided with strips 17 of conducting material on one or both sides of the board 16 forming portions of the printed circuit. As shown in FIG. 11, the conducting strips 17 are arranged with portions thereof disposed in spaced relation to each other along the margins of the board 16.

The electrical component 15 has a body portion 19 and a pair of leads 20 extending from opposite ends thereof along the axis of the body. The component 15 is attached to the wiring board 16 with the body 19 thereof in spaced relation to the board, the leads 20 of the component being shaped to provide shoulder portions 22 engageable with the upper surface of the board 16, portions 23 engageable with the edges of the board, and end portions 24 clinched to the bottom of the board to cooperate with the shoulder portions 22 to securely attach the components onto the board. The portions 22 or 24 of the leads also engage the conducting strips 17 and establish electrical connections therewith.

The apparatus comprises a carrier 30 (FIGS. 1–3) having a flat upper surface for supporting a wiring board 16 thereon and having clamping elements 31 and 31 engageable with the ends of the wiring board for releasably securing the wiring board thereon. At the upper portion and on opposite sides thereof, the carrier 30 is provided with a plurality of laterally extending fingers 32 for supporting the longitudinal marginal portions of the wiring board 16 and providing clearance recesses between the fingers to permit the end portions of the leads to be clinched around the wiring board.

Figure 2:
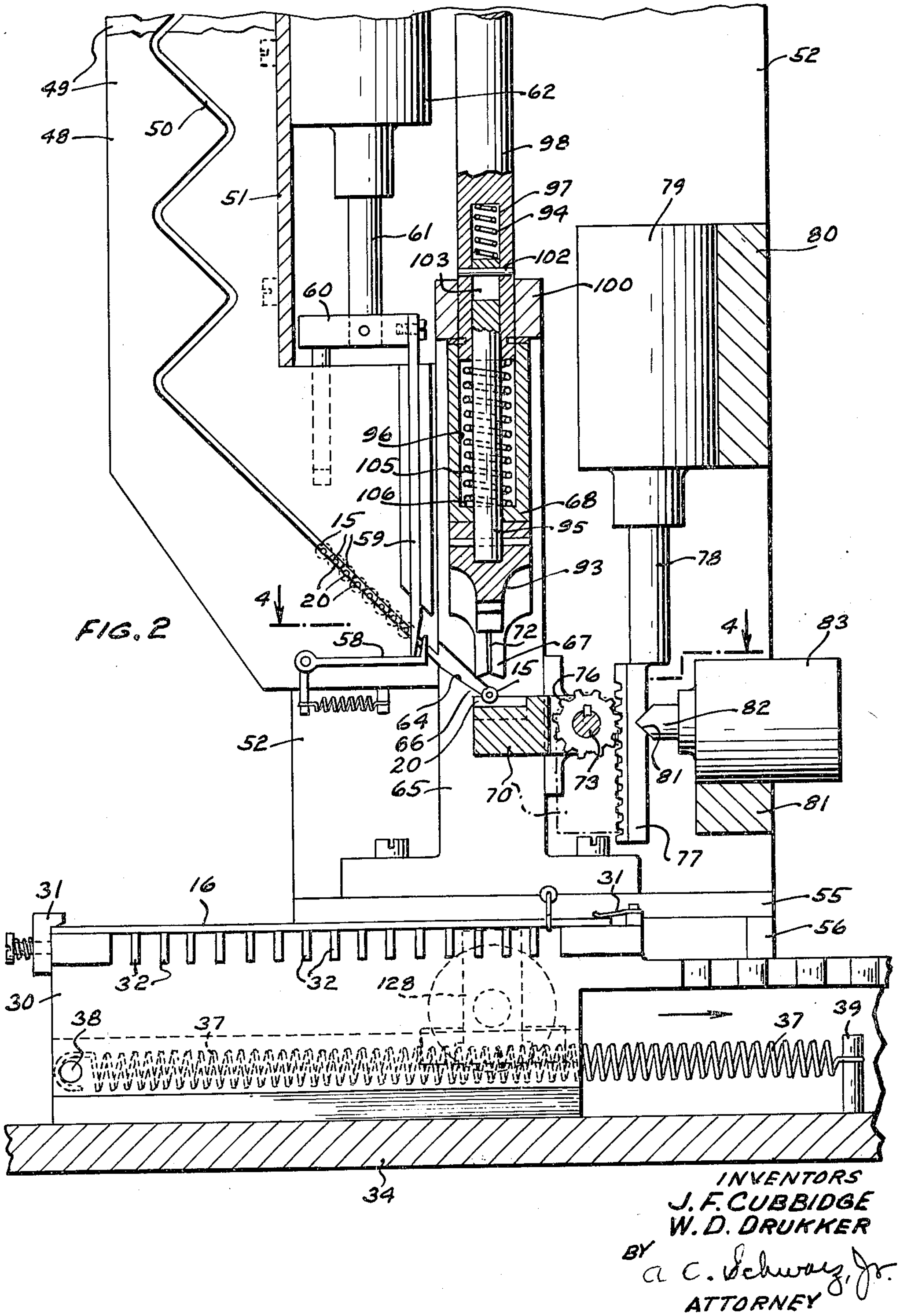
FIG. 2 is a fragmentary vertical longitudinal sectional view through the apparatus taken along line 2—2 of FIG. 1.
Figure 3:
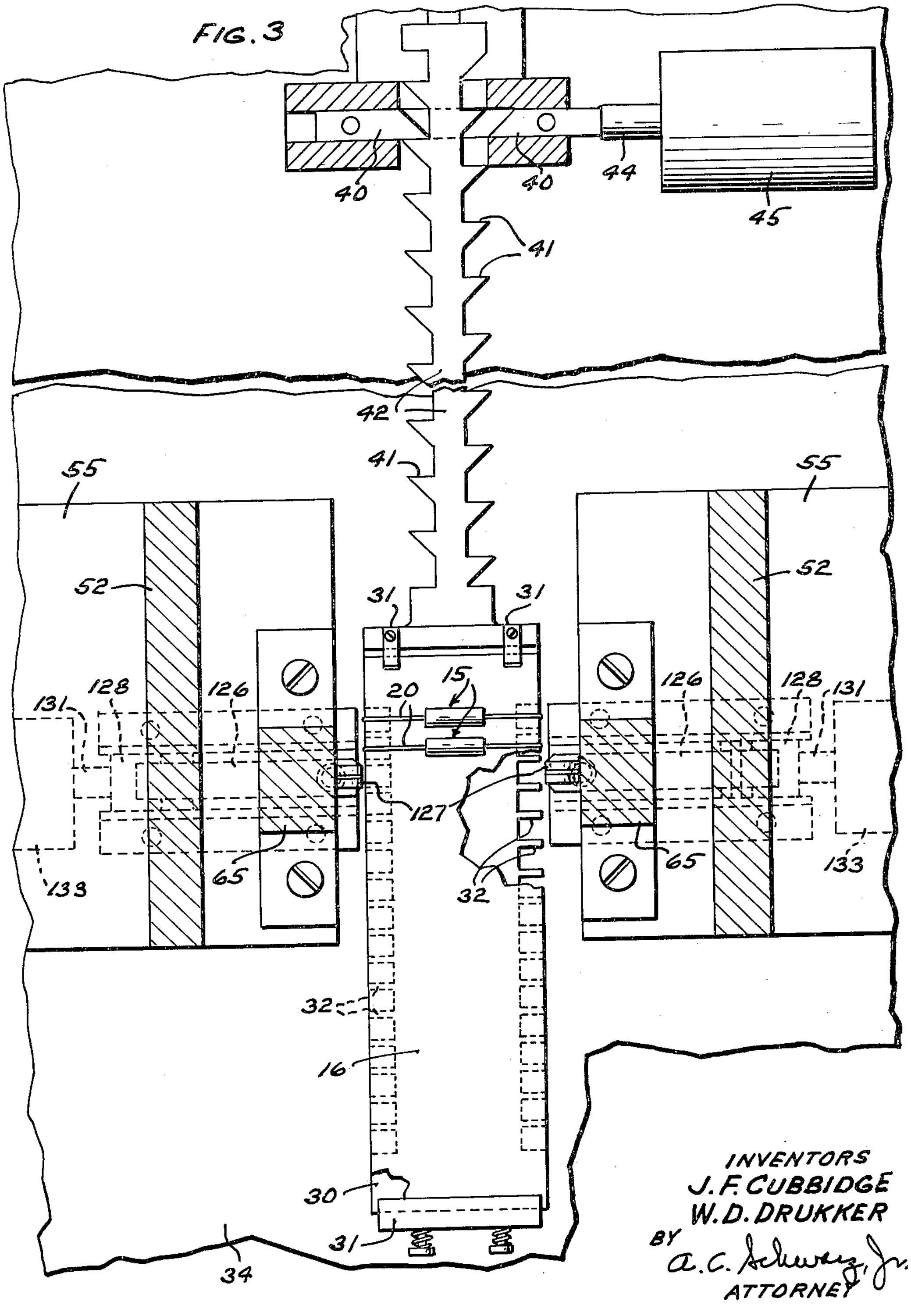
FIG. 3 is a fragmentary horizontal sectional view of the apparatus taken along line 3—3 of FIG. 1.

The carrier 30 is in the form of a slide mounted for horizontal sliding movement on a base plate 34 and in a slideway formed in guide members 35 on the base plate, and the carrier is stressed for movement to the right as viewed in FIG. 2 by a spring 37 connected at one end to a pin 38 on the carrier and at the other end to a pin 39 on the base plate. In cooperation with the spring 37, step by step indexing movement is imparted to the carrier under control of a pair of feed pawls 40 (FIG. 3) which cooperate with two sets of ratchet teeth 41 formed on opposite sides of a ratchet bar 42 secured to one end of the carrier 30. The feed pawls 40 are mounted on a bar 44 which is actuated by an air-operated actuator 45 to effect the indexing of the carrier 30.

A supply of the components 15 is placed in a hopper 48 (FIG. 2) which comprises a pair of vertically disposed horizontally spaced plates 49 having slots 50 therein for receiving the leads of the components and for locating the body 19 therebetween in a predetermined position on the apparatus. The hopper 48 is attached by mounting flanges 51 thereon to vertical frame members 52 which are interconnected at their upper ends by a cross bar 54 (FIG. 1) and are mounted at their lower ends on horizontal frame plates 55 which in turn are secured to vertical spacer plates 56 on the base plate 34.

The electrical components 15 are released from the magazine hopper by an escapement mechanism including a pair of holding pawls 58 and a pair of feed pawls 59. The holding pawls 58 are pivotally mounted on the plates 49 and spring stressed to normal positions in engagement with the leads of the lowermost component 15 for releasably holding the components in the magazine. The feed pawls 59 are connected to a head 60 carried by a piston rod 61 which is reciprocated by a fluid-operated actuator 62 in timed relation to the indexing of the carrier 30 to cause the feed pawls 59 to move between the leads 20 of the lowermost pair of the electrical components 15 in the magazine 48 and depress the holding pawls 58 to release the lowermost component 15 from the magazine while restraining the other components.

As the electrical component 15 is released from the magazine, the straight leads 20 thereof are guided into slots 64 in vertically disposed members 65 on the horizontal frame plate 55 and come to rest at the bottom of the slots in a predetermined operative position. Portions of the vertically disposed members 65 form stationary shearing dies 66 with the lower edges of the slots 64 forming shearing edges for shearing the leads 20 to a predetermined length in cooperation with a pair of movable bending and shearing dies 67 extending downwardly in parallel relation to each other from a head 68.

The head 68 is slidable vertically between the stationary shearing dies 66, and the dies 67 on the head 68, in addition to shearing the leads 20 in cooperation with the stationary shearing dies 66, serve to bend end portions of the leads 20 about the ends of a forming anvil 70 (FIGS. 1 and 2) to form a pair of parallel legs 71 (FIG. 7) on the leads disposed at right angles to the axis of the component body 19 and spaced apart a predetermined distance for straddling the wiring board 16. Vertical grooves 72 are formed in the arms 67 to provide clearance for receiving the legs 71 of leads 20.

The anvil 70 is secured to a shaft 73 which is supported in bearings 74 (FIG. 4) on the members 65 and has a gear 76 secured thereto. Meshing with this gear is a rack 77 carried by a piston 78 which is reciprocated by a fluid-operated actuator 79 for moving the anvil 70 to and from a horizontal operative position and an inoperative position indicated in full and dotted lines in FIG. 2. The rack 77 has a notch 81 therein into which a plunger 82 is pressed by a fluid-operated actuator 83 to releasably lock the anvil in its horizontal operative position. The actuators 79 and 83 are mounted on cross bars 80 and 81, respectively, extending between the vertical frame members 52.

It will be understood that the body 19 of the component 15 is positioned by the magazine 48 in vertical alignment with the longitudinal center of the carrier 30 and midway between the stationary shearing dies 66 so that as the movable shearing dies 67 descent from their normal upper position, they shear the leads 20 to predetermined equal lengths and then bend the ends 71 thereof about the ends of the anvil 70. The anvil 70 has a recess 87 for receiving the body 19 of the electrical component therein and has forming surfaces 88 and 89 (FIG. 1) which cooperate with conforming surfaces 90 and 91 on a movable forming die 93 for preforming the leads 20 before the component 15 is attached to the wiring board 16.

The forming die 93, disposed between the shearing dies 67 of the head 68 for movement therewith and for limited movement relative thereto, is fixed to one end of a rod 95 (FIGS. 1 and 2) which extends upwardly through a counterbore 96 in the head 68 and into a bore 97 in an actuating rod 98. The rod 98 fits in the counterbore 96 of the head 68 and extends upwardly through a bore 99 in a cross bar 100 on the upper ends of the frame members 65, through an aperture in the cross bar 54 and is connected to a piston reciprocable in a cylinder of a fluid-operated actuator 101 for imparting vertical movement to the head 68 and the forming member 93. A pin 102 in the actuating rod 98 extends through a slot 103 in the rod 95 and serves to connect the forming member 93 to the actuating rod 98 for movement therewith and for a limited movement relative thereto. A spring 104 in the bore 97 of the actuating rod 98 serves to stress the rod 95 and the forming die 93 downwardly and to permit relative movement between the actuating rod 98 and the forming die 93 to the extent permitted by the pin and slot connection 102, 103. A spring 105 interposed between the end of the actuating rod 98 and a shoulder 106 of the counterbore 96 urges the head 68 downwardly relative to the rod 98 and permits relative movement therebetween.

When the actuator 101 moves the rod 98 downwardly, the rod carries the head 68, the shearing dies 67 and the forming die 93 therewith and causes the shearing dies 67 to shear the leads 20 and then bend them downwardly into engagement with the horizontal forming surfaces 89 on the anvil 70 and then bend the end portions of the leads about the ends of the anvil into vertical and parallel relation to each other to form the legs 71. Continued downward movement of the head 68 causes the forming die 93 to reshape portions of the leads against the forming surfaces 88 and 89 of the anvil 70 to the condition shown in FIG. 7 after which the anvil is retracted by the actuator 79 to the vertical position shown in dotted lines in FIG. 2.

Figure 8:
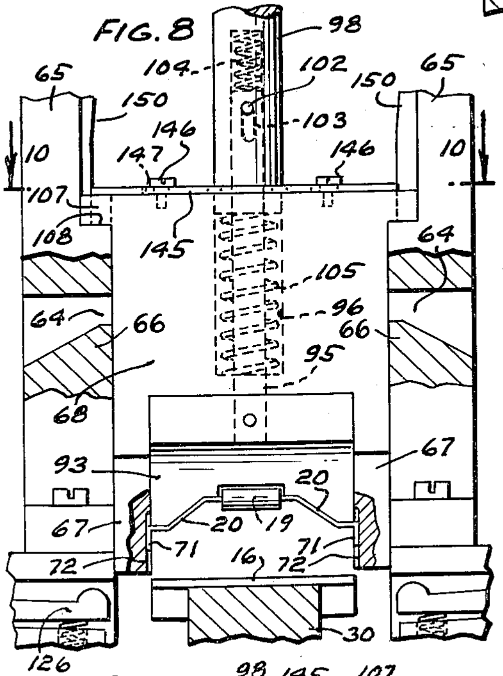
Figure 9:
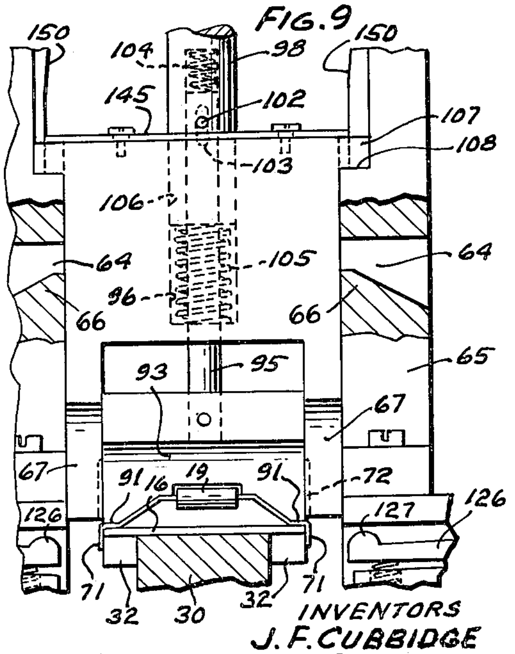

While the anvil is held in the retracted position, continued downward movement of the head 68 carries the shearing dies 67 and the thus-formed component 15 into close proximity to the wiring boards 16 as shown in FIG. 8 in which position the downward movement of the head 68 is arrested by engagement of a pair of laterally disposed lugs 107 on the head 68 with stationary abutments 108 on the vertical members 65. Continued downward movement of the actuating rod 98 moves the forming die 93 a limited distance relative to the now stationary head 68 and causes it to eject the component 15 from the grooves 72 in the shearing and bending dies 67 and to transfer the component onto the board 16. The actuating rod 98 continues its downward movement for a limited distance to compress the spring 104 and cause it to apply a firm pressure to the rod 95 and the forming die 93 to clamp the shoulder portions 22 of the leads 20 against the wiring board 16 and hold the component 15 in position as shown in FIG. 9 while the ends of the leads are clinched about the edges of the wiring board. During this latter movement of the actuating rod 98 relative to the rod 95 and the forming die 93, the pin 102 in the rod 98 moves downwardly in the slot 103 in the rod 95.

The end portions of the leads extending downwardly below the wiring board 16 are bent laterially and clinched tightly to the underneath side of the board by a pair of clinching members 126 (FIGS. 1, 2 and 5) which have rounded surfaces 127 engageable with the leads. The clinching members are pivotally mounted on slides 128 for rocking movement about pivot pins 129 and the forward ends thereof are maintained in normal upper positions by springs 130. The slides 128 are mounted in guideways in the guides 35 for movement to and from the carrier 30 and are connected to piston rods 131 and reciprocated therewith by fluid-operated actuators 133 fixedly mounted on the base plate 34.

Figure 1:
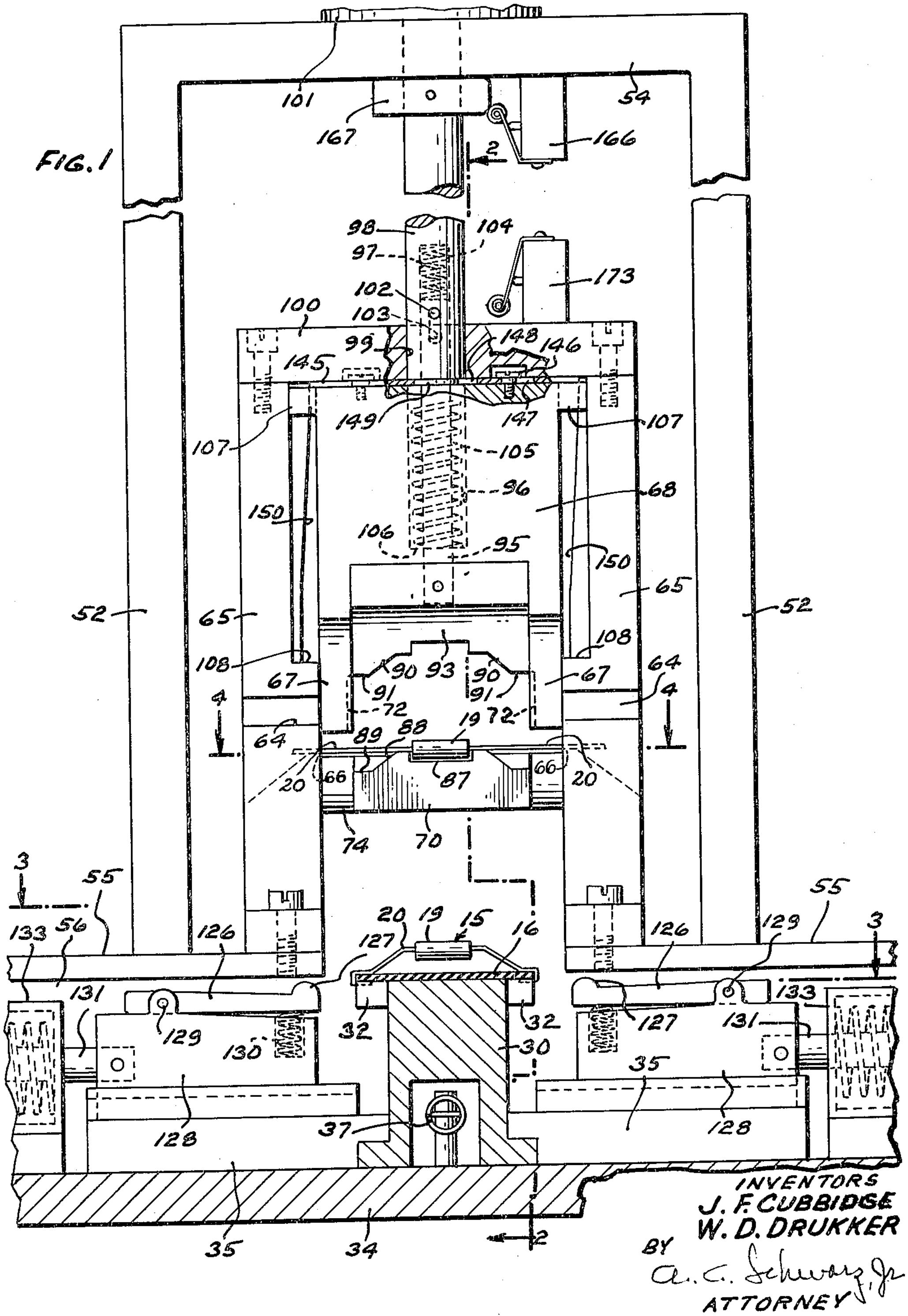
FIG. 1 is a fragmentary vertical elevational sectional view of the apparatus embodying the present invention.

After the clinching members 126 have bent the ends 24 of the leads against the underside of the wiring board 16 to securely attach the electrical component 15 to the wiring board 16 and the clinching members 126 have been retracted, the actuating rod 98 is moved upwardly by the actuator 101 and after the pin 102 in the rod 98 reaches the upper end of the slot 103 in the rod 95, the pin will pick up the rod 95 and the forming member 93 and move them upwardly relative to the head 68 from an advanced position as shown in FIG. 9 to a retracted position as shown in FIG. 8 and then pick up the head and return it and the forming member 93 to their normal upper position as shown in FIG. 1.

Figure 10:
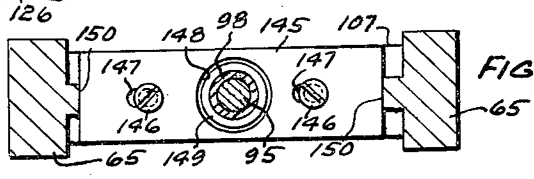
FIG. 10 is a fragmentary plan sectional view taken on line 10—10 of FIG. 8.

Means are provided for locking the head 68 to the rod 98 to insure that the movable shearing dies 67 and the forming die 93 move together while they effect the shearing and the reshaping of the leads 20. As shown in FIGS. 1, 8 and 10, a locking plate 145 is slidably secured to the upper surface of the head 68 by a pair of headed screws 146 which are threadably secured to the head 68 and extend through slots 147 in the plate 145. A central aperture 148 in the locking plate provides clearance for movement of the rod 98 therethrough when the locking plate is in its unlocked position on the head 68 as shown in FIGS. 8 and 9 and the rod is provided with an annular groove 149 for receiving a portion of the plate therein to effect a locking engagement between the head 68 and the rod 98 when the plate 145 is moved to the right from its unlocked position in FIG. 8 to a locked position as indicated in FIG. 1.

The ends of the locking plate 145 engage elongated cam members 150 which are formed on the vertical members 65 and have sloping surfaces thereon for imparting lateral movement to the locking plate 145. The cams are designed to position and maintain the locking plate in locking engagement in the groove 149 of the actuating rod 98 during the downward movement of the head 68 from its normal upper position as shown in FIG. 1 while the leads 20 are being sheared and reshaped on the anvil 70, and to effect the unlocking and release of the head 68 from the actuating rod 98 at a point slightly in advance of its lowermost position shown in FIG. 8. The head 68 is thus unlocked from the rod 98 by the time the movement of the head is arrested in its lowermost position so that as the rod 98 continues its downward movement, it carries along with it the forming die 93 to cause it to eject the component 15 from the shearing dies 67 and press it firmly against the wiring board 16 as shown in FIG. 9.

After the leads 20 have been clinched to the wiring board 16 and during the upward return movement of the actuating rod 98, the rod 98 carries the forming die 93 upwardly into engagement with the head 68 and then carries the head upwardly during which upward movement of the head, the locking plate 145 is moved by one of the cams 150 into the groove 149 to effect a locking connection between the rod 98 and the head 68.

Figures 4, 5:
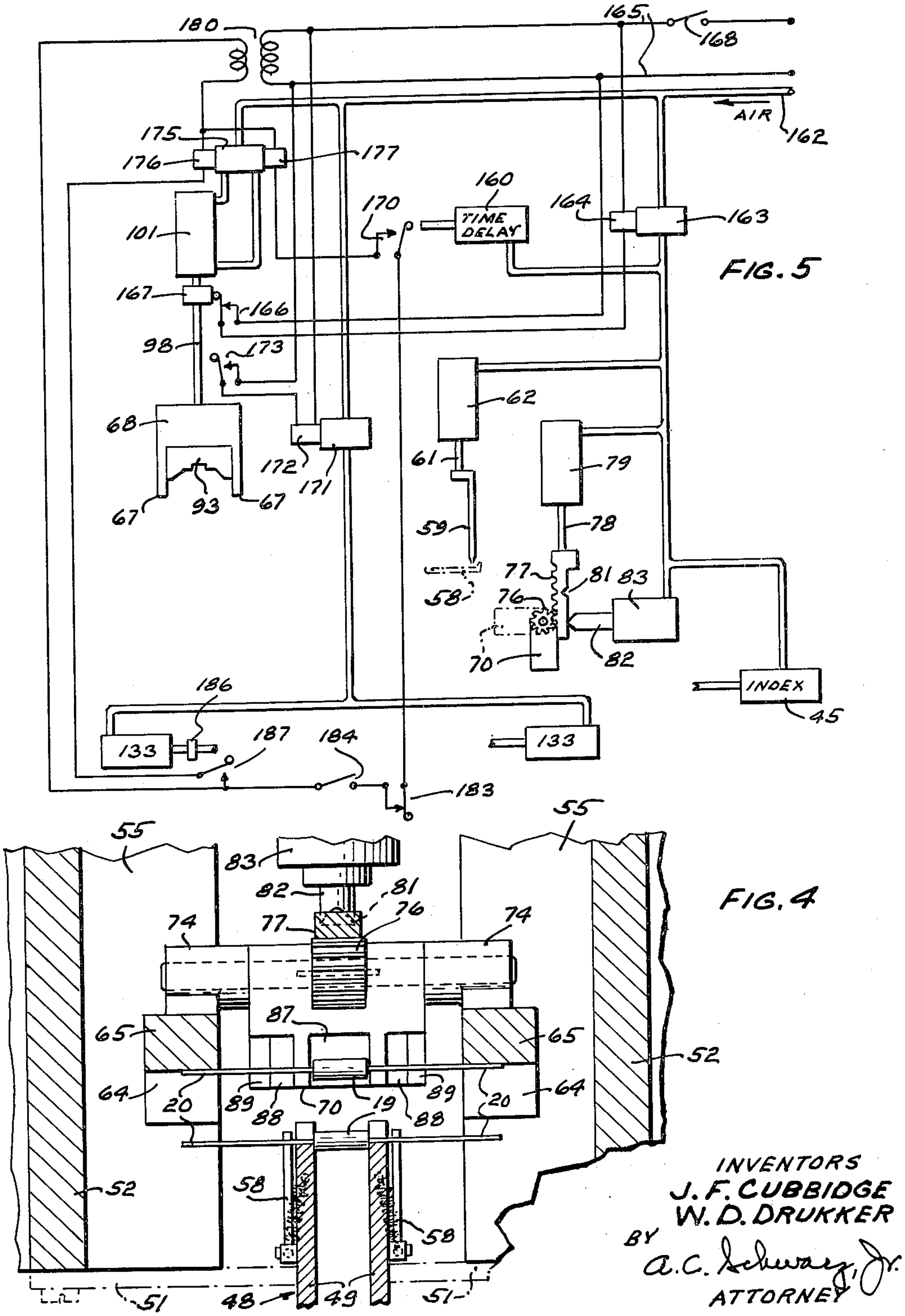
FIG. 4 is a fragmentary horizontal sectional view of the apparatus taken on lines 4—4 of FIGS. 1 and 2.
FIG. 5 is a diagrammatic view of the actuating mechanisms of the apparatus.

The control mechanism for effecting the sequential operation of the components of the apparatus is shown diagrammatically in FIG. 5. The fluid-operated actuators 45, 62, 79, 83 and a time-delay fluid-operated actuator 160 each have pistons therein which are spring returned to a normal retracted position and are advanced by compressed air from a suitable source such as a high-pressure air line 162. The compressed air is admitted to the several actuators under control of a valve 163 having a movable piston therein which is spring urged to a normal shut-off position and is actuated to open positon by a solenoid 164 in response to energization thereof. The solenoid 164 is connected to a power line 165 in series with a normally open switch 166 which is mounted on the apparatus for actuation by a cam 167 on the actuating rod 98 of the fluid-operated actuator 101.

When a manually-operated switch 168 in the power lines 165 is closed, the solenoid 164 is energized and the valve 163 is shifted to cause the compressed air to operate the fluid actuator 45, to index the carrier 30 and the wiring board 16 to its first operative position, to cause the fluid actuators 79 and 83 to swing the forming anvil into operative position and to lock it there, to cause the fluid actuator 62 to effect the feeding of a component 15 from the magazine into shearing postion on the stationary shearing dies, and to cause the actuator 160 after a predetermined time delay to close a normally open switch 170.

The clinching-tool actuators 133, 133 have pistons which are spring urged to normally retracted positions and are advanced by compressed air from the supply line 162 under control of a valve 171. This valve is spring urged to a normal off position and is actuated to an open position by a solenoid 172 which is electrically connected to the power line 165 in series with a normally open switch 173 mounted on the apparatus for actuation by the cam 167 on the actuating rod 98 of the actuator 101.

The actuator 101 has a piston which is reciprocated by the admission of compressed air from the supply line 162 to opposite ends of the actuator under control of a valve 175 having a piston movable from one position to another by a pair of solenoids 176 and 177 in response to alternate energization thereof. The solenoid 177 is connected to the secondary of a transformer 180 connected to the power line 165 and this solenoid 177 is in series with the switch 170, a normally closed carrier stop switch 183 and a manually-operable switch 184.

Figure 7:
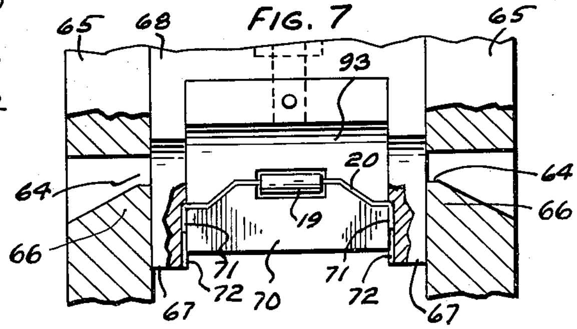

Assuming that the switch 184 has been closed as a first step of the operation, then with the closing of switch 170 by the time-delay actuator 160, the solenoid 177 is energized to move the valve 175 to the position to cause the actuator 101 to move the rod 98 and the head 68 downwardly to effect the shearing of the leads 20 and the forming of the leads 20 about the anvil 70 as shown in FIG. 7. The ends which are sheared from the leads 20 slide down the sloping bottom surfaces of the slots 64 in the dies 66 and drop into receptacles (not shown). After the leads 20 of the component 15 have been sheared and partially formed to the position shown in FIG. 7 and as the rod 98 continues to descend, the cam 167 disengages the switch 166 which returns to open position and causes the shifting of the valve 163 to closed position. This shuts off the air supply to the actuators 45, 62, 79, 83 and 160 which are thereby spring returned to their normal retracted positions and reset the mechanisms associated therewith, including the return movement of the forming anvil 70 to its inoperative position.

After the leads have been thus sheared and partially formed and as the actuating rod 98 and the lead shearing and forming head 68 continue their downward movement to move the component 15 from between the shearing dies 67 into engagement with the wiring board 16 with the ends of the leads projecting downwardly therefrom as shown in FIG. 9, the cam 167 closes the switch 173 to effect the energization of the solenoid 172, the shifting of the valve 171 and the operation of the clinching-tool actuators 133 to clinch the downwardly projecting ends 71 of the leads against the underneath side of the wiring board 16. On completion of the clinching operation, a cam 186 on one of the clinching-tool slides 128 closes a normally open switch 187 connected to the transformer secondary in series with the solenoid 176 to energize the solenoid and cause the actuator 101 to reverse the movement of the actuating rod 98 and the forming member 93 and the shearing head 68 carried thereby.

As the cam 167 moves upwardly with the actuating rod 98, it opens the switch 173 and closes the switch 166. With the opening of the switch 173, the solenoid 172 is deenergized and the valve 171 is shifted to its closed position resulting in the reverse operation of the actuators 133 and the retraction of the clinching tools 126 during which the switch 187 is returned to its open position. With the closing of the switch 166 by the upward movement of the cam 167, the solenoid 164 is energized and the valve 163 is shifted to open position allowing the compressed air to operate the actuators 45, 62, 79, 83 and 160 and initiate another cycle of operation of the apparatus.

After a predetermined number of cycles have been completed and the required number of electrical components 15 applied to the wiring board 16, the carrier 30 actuates the normally closed switch 183 to open position to terminate the operation of the apparatus. The manual control switch 184 may then be opened, the carrier 30 returned to starting position and the wiring board with the components 15 attached removed therefrom and another wiring board applied thereto after which the switch 184 may be again closed to initiate the operation of the apparatus.

It is to be understood that the above-described arrangements are simply illustrative of the application of this invention. Numerous other arrangements may be readily devised by those skilled in the art which will embody the principles of the invention and fall within the spirit and scope thereof.

What is claimed is:

1. In an apparatus for attaching electrical components to wiring boards wherein the electrical components have bodies with leads extending from opposite ends thereof, means for holding the wiring board, means for forming the leads to provide intermedite portions displaced laterally to one side of the body for engaging one side of the board and to provide laterally directed parallel end portions for receiving the board therebetween, means for moving and holding the thus-formed component onto the board with said intermediate portions of the leads thereof in engagement with marginal portions of one side of the board and the end portions straddling and projecting beyond the board and with the body in spaced relation to the board, means movable relative to said board holding means and the board thereon in directions substantially parallel to said one side of the board for bending the end portions of the leads around and against the edges of the board and against the other side thereof to attach the component to the board with the body thereof spaced from the board, and mounting means for supporting the several means in predetermined relation to one another and for relative movement therebetween.

2. In an apparatus for attaching electrical components to wiring boards wherein the electrical components have bodies with coaxial leads extending from opposite ends thereof, means for supporting the wiring board, means for shearing the leads to provide leads of predetermined length, means for reshaping the leads to provide intermediate portions displaced laterally from the axis of the leads and to one side of the body and to provide parallel end portions disposed transversely of said axis for straddling the board, means for moving the thus-formed component onto the board with the body spaced from the board and with the intermediate portions of the leads in engagement with the margins of the board on one side thereof and the transversely disposed end portions of the leads extending across opposite edges of the board and projecting partially beyond the other side thereof, means including a pair of clinching members movable relative to said board supporting means and the board thereon in a direction substantially parallel to said one side of the board for pressing the leads against the edges of the board and for clinching the projecting end portions of the leads against the other side of the board to secure the component to the board with the body thereof in spaced relation to the board, and mounting means for supporting the several means in predetermined relation to one another and for relative movement therebetween.

3. In an apparatus for attaching electrical components to wiring boards wherein the electrical components have bodies with coaxial leads extending from opposite ends thereof, a holder for supporting a wiring board, a pair of stationary shearing members disposed on opposite sides of said holder and engageable with the leads of the component for supporting the component above said holder and the wiring board thereon, a pair of movable shearing dies cooperable with said shearing members for shearing the leads of the component, a forming anvil cooperable with said shearing die for bending the ends of the leads transversely of the axis of the leads into parallel relation to each other, a forming die cooperable with said forming anvil to reshape intermediate portions of the leads to provide shoulders thereon disposed laterally beyond the body of said component, means for sequentially actuating said shearing dies, said forming anvil and said forming die to effect the shearing of the leads, the transverse bending of the ends of the leads, the reshaping of the leads and the movement of the component onto the wiring board with the shoulders of the leads in engagement with the margins of the wiring board on one side thereof and with the transversely disposed ends of the leads projecting beyond the board, and means including a pair of clinching dies movable relative to said board supporting means and the board thereon in a direction substantially parallel to said one side of the board for clinching the projecting ends of the leads to the other side of the board to secure the component to the board with the body of the component in spaced relation thereto.

4. In an apparatus for attaching electrical components to wiring boards wherein each electrical component has a body with leads extending from opposite ends thereof along an axis, a pair of stationary shearing dies having seats engageable with the leads for supporting the component a magazine for receiving a supply of components and for guiding them onto said seats with the body of the component centrally located between said stationary dies, means for effecting the feeding of successive components from said magazine onto said seats, a forming anvil movable to and from an operative position between said stationary dies, said anvil having a first pair of forming surfaces engageable with the leads adjacent the body of the component and a second pair of forming surfaces laterally offset relative to said first pair and engageable with intermediate portions of the leads and having a pair of transversely disposed forming surfaces between said first and said second pairs of forming surfaces, a pair of movable shearing and forming dies mounted for movement along a predetermined path between said stationary dies and cooperable therewith to shear the leads to a predetermined length and cooperable with said forming anvil to bend the ends of the leads perpendicular to said axis into parallel relation to each other, for receiving the board therebetween, means for supporting a wiring board in the path of movement of said movable shearing dies, a forming die having surfaces conforming to said forming surfaces of said anvil and cooperable with said anvil for reshaping the leads to provide intermediate portions thereof displaced laterally of said axis and beyond the body of the component, means for moving the anvil to and from said operative position, means for moving said pair of movable shearing and forming dies along said predetermined path to effect the shearing of the leads and the bending of the ends of the leads against the ends of the anvil, means for actuating said forming die to cause it to cooperate with said anvil to form said laterally displaced intermediate portions of the leads and to move and hold the component onto the wiring board with the intermediate portions of the leads in engagement with the margin portions of the board on one side thereof and with the parallel ends of the leads straddling the edges of the board and projecting beyond the board, a pair of clinching dies, means for moving said clinching dies toward said board supporting means and the board thereon in a direction substantially parallel to said one side of the board to press the leads against the edges of the board and to bend the projecting ends of the leads into engagement with the other side of the board to secure the component to the board with the body of the component in spaced relation to the board.

5. In an apparatus for attaching electrical components to wiring boards wherein the electrical components have bodies with coaxial leads extending from opposite ends thereof, a pair of stationary shearing dies engageable with the leads of components for supporting the components therebetween, mounting means for supporting said stationary shearing dies, a carrier on said mounting means for supporting the wiring board for movement between said stationary dies and below the electrical components, means on said mounting means for indexing said carrier to advance successive portions of the wiring board in alignment with and below the components supported on said stationary shearing dies, a magazine for receiving a supply of components and guiding each component onto said stationary shearing dies with the body of the component centrally located therebetween, means on said mounting means operable in timed relation to said indexing means for effecting the feeding of a component from said magazine onto said stationary shearing dies, a forming anvil supported on said mounting means, means operable in timed relation to said indexing means for actuating said forming anvil to and from an operative position between said stationary dies for supporting the component, a pair of movable shearing and forming dies mounted between said stationary dies, means operable in timed relation to said indexing means for moving said pair of shearing and forming dies toward and from said carrier for cooperation with said stationary dies to shear the leads to a predetermined length and for cooperation with said forming anvil to bend the ends of the leads transversely of said axis in parallel relation to each other, a forming die disposed between the movable shearing dies and above a component supported thereon, means operable in timed relation to said indexing means for moving said forming die for cooperation with said anvil to reshape the leads to provide intermediate portions thereof disposed laterally beyond the body of the component and to move and hold the component onto the wiring board with the intermediate portions of the leads in engagement with the marginal portions of the board on one side thereof and with the transversely disposed end portions of the leads straddling the board and projecting beyond the board, a pair of clinching dies on said mounting means, and means operable in timed relation to said indexing means for moving said clinching dies toward said board supporting means and a board thereon in a direction substantially parallel to said one side of the board to press the leads against the edges of the board and to bend the projecting ends of the leads into engagement with the other side of the board to secure the component to the board with the body of the component in spaced relation to the board.

6. In an apparatus for attaching electrical components to wiring boards wherein the electrical components have bodies with coaxial leads extending from opposite ends thereof, a pair of stationary shearing members having seats engageable with the leads of a component for supporting the component between said shearing members, mounting means for supporting said stationary shearing members, a carrier mounted on said mounting means for supporting a wiring board between said shearing members and below said seats thereon for movement along a predetermined path, means on said mounting means for indexing said carrier to advance successive portions of the board below successive components supported on said seats, a magazine for holding a supply of components and guiding them onto said seats with the body of the component centrally located between said shearing members, means on said mounting means for effecting the feeding of components from said magazine onto said seats, a forming anvil, means for actuating said forming anvil to and from an operative position between said shearing members, a pair of movable shearing and forming dies mounted between said shearing members, means for actuating said shearing and forming dies toward and from said carrier for cooperation with said shearing members to shear the leads to a predetermined length and for cooperation with said forming anvil to bend the ends of the leads into parallel relation to each other for receiving the wiring board therebetween transversely of the axis of said leads, a forming die disposed between the shearing dies, means on said mounting means for actuating said forming die for cooperation with said anvil to reshape the leads to provide intermediate portions thereof disposed laterally beyond the body of the component and to move and hold the component onto the wiring board with the intermediate portions of the leads in engagement with the marginal portions of the board on one side thereof and with the transversely disposed end portions of the leads straddling the board and projecting beyond the board, a pair of clinching dies on said mounting means, means on said mounting means for actuating said clinching dies toward said board supporting means and the board thereon in a direction substantially parallel to said one side of the board to press the leads against the edges of the board and to bend the projecting ends of the leads into engagement with the other side of the board to secure the component to the board with the body of the component in spaced relation to the board, and means for effecting the operation of said actuating means in a predetermined sequence.

7. In an apparatus for attaching electrical components to wiring boards wherein each electrical component has a body with leads extending from opposite ends thereof along an axis, a pair of stationary shearing members having seats engageable with the leads for supporting the component, means for feeding a component onto said seats with the body of the component centrally located between said stationary members, means for supporting a wiring board between said stationary shearing members and below said seats thereon, a forming anvil movable to and from an operative position between said shearing members and between the component on said seats and the wiring board on said supporting means, a movable element having a pair of movable shearing dies disposed between said stationary shearing members and above the seats thereon, said movable shearing dies having shearing edges cooperable with said shearing members to shear the leads and having forming surfaces cooperable with said forming anvil to bend the end portions of the leads perpendicular to said axis and for supporting the component when said forming anvil is moved from said operative position, means for actuating said forming anvil, a movable forming die mounted on said element between said shearing dies for movement therewith and relative thereto and cooperable with said forming anvil for reshaping the leads to form portions thereof displaced laterally from said axis for engaging marginal portions of the wiring board, an actuating rod slidably mounted on said element and connected to said forming die for moving said element and said forming die toward and from said wiring board supporting means, resilient means for yieldably maintaining said forming die in engagement with said element for movement together through a predetermined distance, means for stopping the movement of said element and said shearing dies with the ends of said shearing dies adjacent the wiring board on said supporting means, an actuator for moving said actuating rod to effect the movement of said element and said forming die downwardly together until said element is stopped and to effect the continued movement of said forming die to eject the component from said shearing dies onto the wiring board and to hold said component against one side of said board with the transversely disposed ends of the leads straddling the wiring board and projecting downwardly beyond the board, a pair of clinching dies, and means for actuating said clinching dies toward said board supporting means and the board thereon in a direction substantially parallel to said one side of the board to press portions of the downwardly projecting ends of the leads against the edges of the wiring board and to bend portions of the downwardly projecting ends of the leads against the other side of the board to secure the component thereto.

References Cited in the file of this patent

UNITED STATES PATENTS

| | | |
|---|---|---|
| 432,375 | Coleman | July 15, 1890 |
| 1,282,599 | Larsen | Oct. 22, 1918 |
| 2,747,188 | Greener | May 29, 1956 |
| 2,791,772 | Cardani | May 14, 1957 |
| 2,827,630 | Kwasniewski | Mar. 25, 1958 |
| 2,836,693 | Yarbrough | May 27, 1958 |
| 2,869,126 | Johnson | Jan. 20, 1959 |
| 2,902,691 | Kwasniewski | Sept. 8, 1959 |